(12) United States Patent
Koli

(10) Patent No.: US 10,992,310 B2
(45) Date of Patent: *Apr. 27, 2021

(54) RECEIVER FOR A TELECOMMUNICATION SYSTEM

(71) Applicant: HUAWEI TECHNOLOGIES CO., LTD., Guangdong (CN)

(72) Inventor: Kimmo Koli, Helsinki (FI)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/906,231

(22) Filed: Jun. 19, 2020

(65) Prior Publication Data

US 2020/0321974 A1 Oct. 8, 2020

Related U.S. Application Data

(63) Continuation of application No. 16/392,899, filed on Apr. 24, 2019, now Pat. No. 10,693,491, which is a continuation of application No. PCT/EP2016/075688, filed on Oct. 25, 2016.

(51) Int. Cl.
*H03M 3/00* (2006.01)
*H03M 1/66* (2006.01)

(52) U.S. Cl.
CPC ............. *H03M 3/372* (2013.01); *H03M 1/66* (2013.01); *H03M 3/464* (2013.01)

(58) Field of Classification Search
CPC ......... H03M 3/372; H03M 3/464; H03M 1/66
(Continued)

(56) References Cited

U.S. PATENT DOCUMENTS 5,719,573 A 2/1998 Leung
5,742,246 A * 4/1998 Kuo .................... H03M 3/362
341/143

(Continued)

FOREIGN PATENT DOCUMENTS

CN 1319276 A 10/2001
CN 1813411 A 8/2006
(Continued)

OTHER PUBLICATIONS

Ken Xu et al: "A 13-mW 0.22-mm2 continuous-time Delta-Sigma ADC with 68-dB dynamic range in 10-MHz bandwidth", 2014 IEEE International Conference on Electron Devices and Solid-State Circuits, IEEE, Jun. 18, 2014, pp. 1-2, XP032747262.

(Continued)

*Primary Examiner* — Peguy Jean Pierre
(74) *Attorney, Agent, or Firm* — Womble Bond Dickinson (US) LLP

(57) ABSTRACT

A receiver is described, the receiver comprising an ABB filter stage, an ADC stage. The ABB filter stage comprises an ABB filter stage input configured to receive an analog baseband, BB, signal and an ABB filter stage output configured to provide a filtered analog BB signal. The ADC stage comprises an ADC stage input configured to receive the filtered analog BB signal and an ADC stage output configured to provide a digital BB signal. The ADC stage comprises an ADC comprising an ADC input configured to receive the filtered analog BB signal or a signal derived therefrom as an ADC input signal, and wherein the ADC is configured to perform an analog-to-digital, A/D, conversion of the ADC input signal to derive the digital BB signal.

18 Claims, 3 Drawing Sheets

(58) Field of Classification Search
USPC .................................. 341/144, 155, 143, 134
See application file for complete search history.

(56) References Cited

U.S. PATENT DOCUMENTS

| | | | |
|---|---|---|---|
| 6,489,907 | B2 | 12/2002 | Cusinato |
| 6,765,517 | B1 | 7/2004 | Ali |
| 10,693,491 | B2 * | 6/2020 | Koli .......................... H03M 1/66 |
| 2006/0164272 | A1 | 7/2006 | Philips et al. |
| 2011/0096878 | A1 | 4/2011 | Mattisson |
| 2012/0139764 | A1 | 6/2012 | Sosio et al. |
| 2015/0097711 | A1 | 4/2015 | Schuurmans |
| 2016/0036460 | A1 | 2/2016 | Mattisson et al. |

FOREIGN PATENT DOCUMENTS

| | | |
|---|---|---|
| CN | 104579346 A | 4/2015 |
| EP | 2959589 A1 | 12/2015 |

OTHER PUBLICATIONS

Englund Mikko et al: "A Programmable 0.7-2.7 GHz Direct ΔΣ Receiver in 40 nm CMOS", IEEE Journal of Solid-State Circuits, IEEE Service Center, Piscataway, NJ, USA,vol. 50, No. 3, Mar. 2015, pp. 644-655, XP011573769.

Kathleen Philips et al, A continuous-time ΔΣ ADC with increased immunity to interferers. IEEE Journal of Solid-State Circuits, vol. 39, No. 12, Dec. 2004, 9 pages.

M. Sosio et al, A complete DVB-T/ATSC tuner analog base-band implemented with a single filtering ADC. 2011 Proceedings of the ESSCIRC (ESSCIRC), Oct. 13, 2011, 4 pages.

Mattias Andersson et al, A 9MHz filtering ADC with additional 2nd-order ΔΣ modulator noise suppression.2013 IEEE, 4 pages.

Mattias Andersson et al, A Filtering ΔΣ ADC for LTE and Beyond. IEEE Journal of Solid-State Circuits, vol. 49, No. 7, Jul. 2014, 13 pages.

* cited by examiner

RECEIVER FOR A TELECOMMUNICATION SYSTEM

CROSS-REFERENCE TO RELATED APPLICATIONS

This application is a continuation of U.S. patent application Ser. No. 16/392,899, filed on Apr. 24, 2019, which is a continuation of International Application No. PCT/EP2016/075688, filed on Oct. 25, 2016. All of the afore-mentioned patent applications are hereby incorporated by reference in their entireties.

TECHNICAL FIELD

The present application relates to a receiver for a telecommunications system.

BACKGROUND

The bandwidth of the radio channel in telecommunications systems is getting wider and wider, from hundreds of kilohertz range in 2 G to tens or even hundreds of megahertz range in 4.5 G and 5 G. This increase in bandwidth requires an ever increasing flexibility especially for radio receiver baseband filtering prior to analogue-to-digital conversion. Furthermore, the receiver silicon area and current consumption should be minimized as more and more receivers have to be integrated on the same chip to support diversity, Multiple Input Multiple Output, MIMO, and carrier aggregation requirements in 4 G and 5 G.

In order to tackle the area and power reduction requirements, several solutions of merging filtering and continuous-time delta-sigma analogue-to-digital converters (ΔΣ ADCs) have been published in recent years.

With present solutions, a feedback digital-to-analog converter DAC injects its signal at the same point where a down converted and almost unfiltered radio frequency, RF, signal is injected. This leads to very low clock jitter specifications thus increasing power consumption and silicon area for the clock generation and distribution.

The main problem with the present solutions for filtering ADCs is that they do not solve the right problem. The present solutions present an energy efficient solution in the medium frequency range (5 . . . 20 MHz), but for wider bandwidths the frequency and phase response of the main ADC affects the total filtering response thus rendering the design very difficult and increasing current consumption. On the other hand, at narrower bandwidths, there is already enough noise shaping in the main ADC so that noise shaping boost of the merged filter is not required.

Another problem with the current solutions is the limited usability with very wide filter bandwidths in respect to the ADC sampling frequency i.e. with low oversampling ratio, OSR.

SUMMARY OF THE APPLICATION

An objective of embodiments of the present application is to provide a receiver which at least diminishes the problems with conventional solutions.

Another objective of the present application is to provide a receiver which enables minimization of silicon area and power consumption in the receiver while maintaining the filtering performance.

The above objectives are fulfilled by the subject matter of the independent claim. Further advantageous implementation forms of the present application can be found in the dependent claims.

According to a first aspect of the present application a receiver is provided comprising: an analog baseband, ABB, filter stage, an analog-to-digital converter, ADC, stage, a first feedback path, and a second feedback path; wherein the ABB filter stage comprises an ABB filter stage input configured to receive an analog baseband, BB, signal and an ABB filter stage output configured to provide a filtered analog BB signal; wherein the ADC stage comprises an ADC stage input configured to receive the filtered analog BB signal and an ADC stage output configured to provide a digital BB signal; wherein the ADC stage comprises an ADC comprising an ADC input configured to receive the filtered analog BB signal or a signal derived therefrom as an ADC input signal, and wherein the ADC is configured to perform an analog-to-digital, A/D, conversion of the ADC input signal to derive the digital BB signal; wherein the first feedback path is configured to feedback the ADC input signal to the ABB filter stage; wherein the second feedback path is configured to feedback the digital BB signal to the ABB filter stage.

The receiver according to the first aspect enables minimization of the silicon area and power consumption. This is due to the fact that the receiver according to the first aspect enables sharing of circuitry between the ABB filter stage and the ADC, which also relaxes the ADC specification, therefore saves area and power.

The receiver according to the first aspect enables elimination of the first feedback DAC thus relaxing clock jitter requirements while maintaining enough noise shaping for the ADC quantization noise.

The receiver according to the first aspect can reach very low OSR even below 4. This can be achieved by using first-order CT ΔΣ ADC or even a Nyquist ADC as the main ADC.

In order to minimize silicon area and power consumption, the analogue baseband filter and analogue-to-digital converter should share as much circuitry as possible. This is achieved according to the first aspect of the application by merging and sharing of the integrator stages of the ABB, filter stage and the ADC, stage.

The power consumption and silicon area is also kept low for narrower bandwidth radio standards due to the use of fewer integrator stages. Part of the filtering ADC dynamic range can be traded off to better frequency selectivity by adding deliberate digital delay in the feedback DAC path. With this method, the filter order is increased by one in the most crucial area just above the low pass filter corner frequency.

In one embodiment, the first feedback path is analog. The analog feedback path stabilizes filter frequency response peaking around the filter corner frequency and thus relaxes unity gain frequency specification of the filter operational amplifier.

In one embodiment, the second feedback path comprises a first feedback digital-to-analog, D/A, converter. The inclusion of a D/A converter in the second feedback path enables a proper feedback from the digital BB signal to the ABB filter stage. The second feedback path also lowers the filter sensitivity. This saves power in the widest bandwidth modes.

In one embodiment, the second feedback path comprises a delay element. By adding a delay element fourth order lowpass filtering is achieved close the corner frequency. At higher frequencies the filter falls back to third order lowpass slope. This method improves receiver frequency selectivity at the expense of slightly decreased SNR. The added delay shifts noise transfer function, NTF, notch down in frequency. The correct notch frequency can be restored with an additional weaker feedback path from quantizer input to the second integrator input.

In one embodiment the ABB filter stage comprises a first summation node, a first integrator, a second summation node and a second integrator; wherein the first summation node is configured to receive the analog BB signal and to provide a first sum signal to the first integrator; wherein the first integrator is configured to integrate the first sum signal to derive a first integrated signal; wherein the second summation node is configured to receive the first integrated signal and to provide a second sum signal to the second integrator; wherein the second integrator is configured to integrate the second sum signal to derive the filtered analog BB signal; wherein each summation node is configured to also receive the signal from one of the first feedback path and the second feedback path; and wherein each summation node is configured to sum the signals input to the respective summation node. The merged ABB and ADC performs third order low pass filtering for the received signal. The merged ABB shapes ADC quantization noise by adding a notch slightly below the low pass filter corner frequency. This is a very useful feature for optimizing wideband SNR of the ADC.

In one embodiment, the first summation node is configured to receive the signal from the first feedback path and the second summation node is configured to receive the signal from the second feedback path. This further enhances the merge of the ABB and the ADC.

In one embodiment, the ADC stage comprises a third integrator coupled between the ADC stage input and the ADC input.

In one embodiment, the ADC stage comprises a third summation node at the ADC stage input and a third feedback path, wherein the third feedback path is configured to feed back the digital BB signal to the third summation node, wherein the third feedback path comprises a second feedback D/A converter, and wherein the third summation node is configured to sum the signal from the third feedback path and the filtered analog BB signal and to provide a resulting third sum signal to the third integrator.

In one embodiment, the ABB filter stage comprises a fourth feedback path connected between the first integrator output of the first integrator and the first summation node. The fourth feedback path enables setting of the gain in the filter. This makes it possible to adapt the receiver to the received analog BB signals.

In one embodiment, a fifth feedback back path is configured to feedback the filtered analog BB signal to the first summation node. This fifth feedback enables further setting of the gain of the receiver. This makes it possible to adapt the receiver to the received analog BB signals.

In one embodiment, the fifth feedback path is analog. This is advantageous as the filtered analog BB signal is an analog signal that is to be fed back to an analog summation node.

In one embodiment, at least one of the first feedback path, the second feedback path, the third feedback path, the fourth feedback path, and the fifth feedback path is switchable. By having at least one of the first feedback path, the second feedback path, the third feedback path, the fourth feedback path, and the fifth feedback path switchable it is possible to adapt the receiver to different analog BB signals.

In one embodiment, the receiver is configured to selectively switch on and switch off the first to fifth feedback path in dependence on the signal type of the received analog BB signal. By having the receiver configured in this way it is possible for the receiver to adapt itself to different analog BB signals.

According to a second aspect of the present application a communication device for a wireless communication system is provided, wherein the communication device comprises a receiver according to anyone of the first to the thirteenth implementation forms of the receiver or to the first aspect as such. Such a communication device has all the benefits as described above for the different implementation forms of the receiver or of the first aspect.

DETAILED DESCRIPTION

Figure 1:
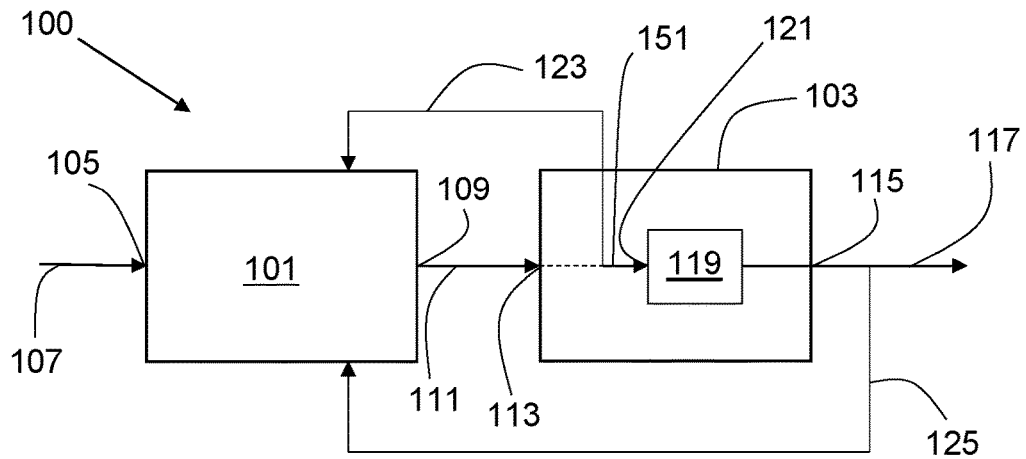
FIG. 1 shows a receiver according to an embodiment of the application.

Below a description of embodiments will follow. In the following description of embodiments similar features in the different embodiments will be denoted with the same reference numeral.

FIG. 1 shows schematically a receiver 100 according to an embodiment of the application. The receiver 100 comprises an analog baseband, ABB, filter stage 101, an analog-to-digital converter, ADC, stage 103, a first feedback path 123, and a second feedback path 125. The ABB filter stage 101 comprises an ABB filter stage input 105 configured to receive an analog baseband, BB, signal 107 and an ABB filter stage output 109 configured to provide a filtered analog BB signal 111. The ADC stage comprises an ADC stage input 113 configured to receive the filtered analog BB signal 111 and an ADC stage output 115 configured to provide a digital BB signal 117. Thus, the ABB filter stage is merged with the ADC stage 103 through the first feedback path 123 and the second feedback path 125. The ADC stage 103 comprises an ADC 119 comprising an ADC input 121 configured to receive the filtered analog BB signal 111 or a signal derived therefrom as an ADC input signal 151. Thus, there might be additional components between the ADC stage input 113 and the ADC input 121 as is indicated by the dotted line. Such additional components will be described below with reference to the other embodiments. The ADC 119 is configured to perform an analog-to-digital, A/D, conversion of the ADC input signal 151 to derive the digital BB signal 117. The first feedback path 123 is configured to feedback the ADC input signal 151 to the ABB filter stage 101. The first feedback path 123 is analog. The second feedback path 125 is configured to feedback the digital BB signal 117 to the ABB filter stage 101. Not shown in FIG. 1 as not essential for understanding the embodiments of the present application are an LNA (low noise amplifier) and a frequency mixer of the receiver 100.

Figure 2:
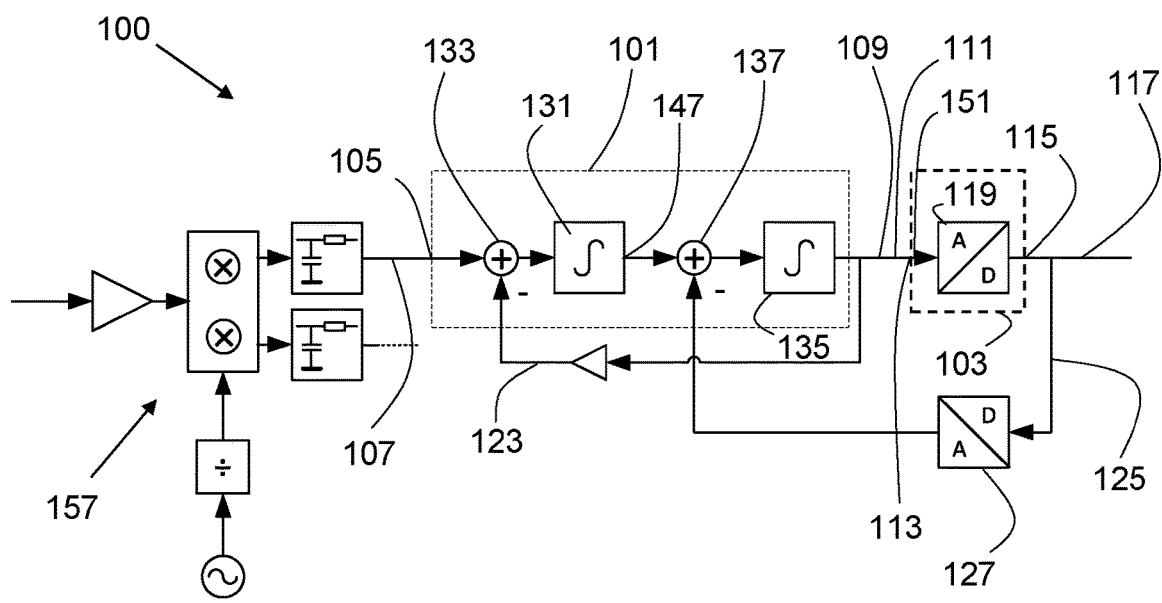
FIG. 2 shows a receiver according to another embodiment of the application.

FIG. 2 shows a receiver 100 according to another embodiment of the application. Only the differences between the embodiment described in FIG. 1 and the embodiment shown in FIG. 2 will be described. In FIG. 2 the ABB filter stage 101 is shown to comprise a first summation node 133, a first integrator 131, a second summation node 137 and a second integrator 135. The first summation node 133 is configured to receive the analog BB signal 107. The first summation node is configured to also receive the signal from the first feedback path 123. As is indicated by the minus sign at the first feedback path close to the first summation node 133 the signal from the first feedback path 123 is inverted before it is input to the first summation node 133. The first summation node 133 is configured to sum the signals input to the first summation node 133 into a first sum signal and to provide the second sum signal to the first integrator 131. The first integrator is configured to integrate the first sum signal to derive a first integrated signal.

The second summation node 137 is configured to receive the first integrated signal. The second summation node 137 is configured to also receive the signal from second feedback path 125. As is indicated by the minus sign at the second feedback path close to the second summation node 137 the signal from the second feedback path 125 is inverted before it is input to the second summation node 137. The second summation node 137 is configured to sum the signals input to the second summation node 137 into a second sum signal and to provide the second sum signal to the second integrator 135. The second integrator is configured to integrate the second sum signal to derive the filtered analog BB signal 111.

As is shown in FIG. 2 the second feedback path 125 comprises a first feedback digital-to-analog, D/A, converter 127. The function of the first feedback digital-to-analog, D/A, converter 127 is to convert the digital BB signal 117, which is output on the ADC stage output 115, into an analog signal to be input to the second summation node 137 after having been inverted.

Figure 3:
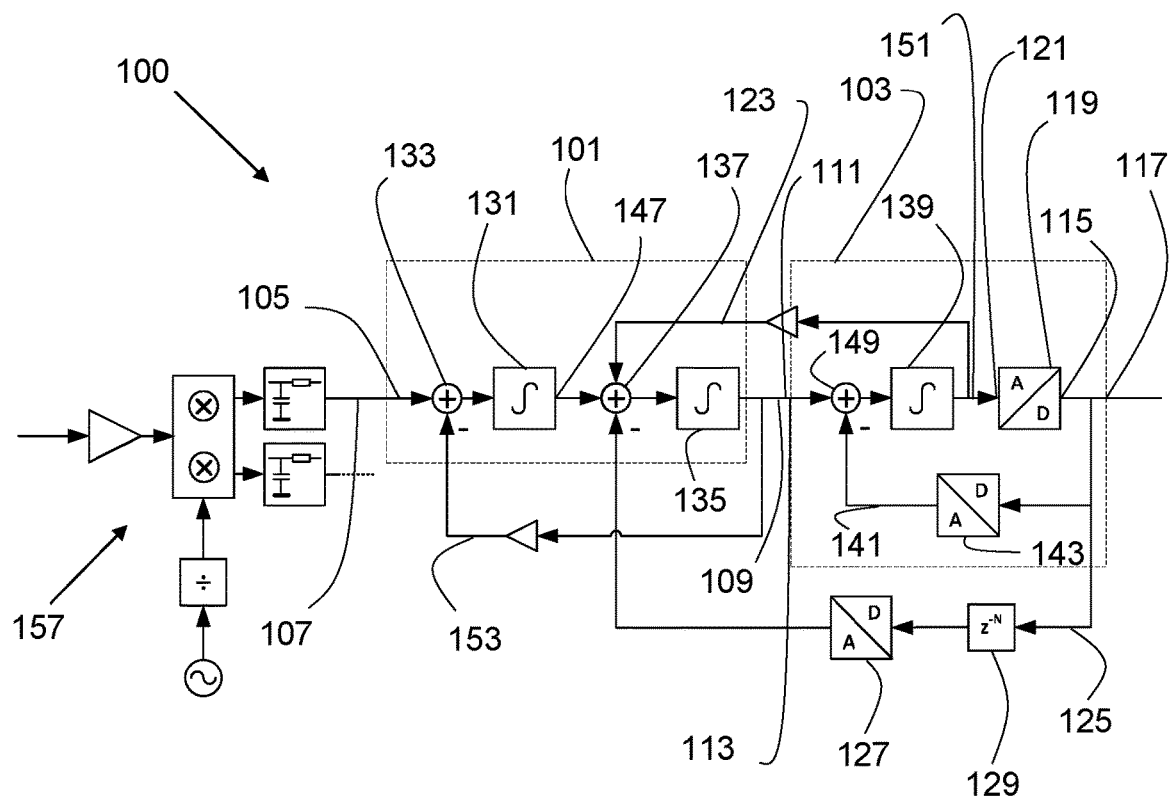
FIG. 3 shows a receiver according to another embodiment of the application.

Also shown in FIG. 2 is an RF front end 157 configured to provide the analog baseband, BB, signal 107. The RF front end 157 shown in FIG. 3 is only one possible implementation of an RF front end. Other implementations would be possible too and are clear for a person skilled in the art. The first feedback path 123 is analog. In a very simple implementation the analog feedback paths described herein may be implemented by resistors.

FIG. 3 shows a receiver 100 according to another embodiment of the application. Only the differences between the embodiment described in FIG. 2 and the embodiment shown in FIG. 3 will be described. The ADC stage 103 comprises a third integrator 139 coupled between the ADC stage input 113 and the ADC input 121. The second feedback path 125 comprises a delay element 129. By adding the delay element 129 fourth order lowpass filtering is achieved close the corner frequency of the receiver 100. The added delay element 129 shifts noise transfer function (NTF) notch down in frequency. However, the correct notch frequency is restored by first feedback path 123 between the ADC input 121 and the second summation node 137. Furthermore, this first feedback 123 path also lowers the filter sensitivity to the limited unity gain frequencies of the integrator Operational Amplifiers, thus saving power in the widest bandwidth modes.

The ADC stage 103 in the receiver shown in FIG. 3 comprises a third summation node 149 at the ADC stage input 113 and a third feedback path 141, wherein the third feedback path 141 which is configured to feed back the digital BB signal 117 to the third summation node 149. The third feedback path 141 comprises a second feedback D/A converter 143. The third summation node 149 is configured to sum the signal from the third feedback path 141 and the filtered analog BB signal 111 and to provide a resulting third sum signal to the third integrator 139.

In FIG. 3 the first feedback path 123 is configured to feedback the ADC input signal 151 to the second summation node 137. This is in contrast to the embodiment shown in FIG. 2 where the first feedback path 123 is configured to feedback the ADC input signal 151 to the first summation node 133. In general the first feedback path 123 enables widest bandwidth with a low in-band ripple of the receiver.

The receiver 100 also comprises a fifth feedback path 153 between the output of the second integrator 135 and the first summation node 133. The fifth feedback path 153 is analog.

Figure 4:
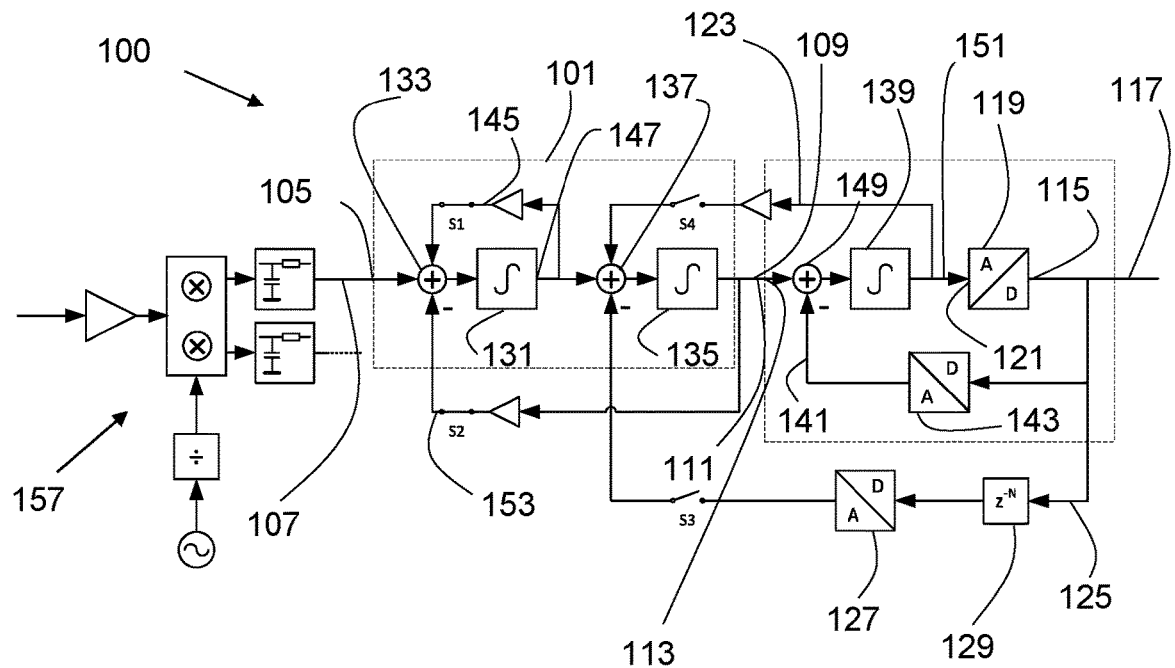
FIG. 4 shows a receiver according to another embodiment of the application.

FIG. 4 shows a receiver 100 according to another embodiment of the application. Only the differences between the embodiment described in FIG. 3 and the embodiment shown in FIG. 4 will be described. The ABB filter stage 101 comprises a fourth feedback path 145 connected between the first integrator output 147 of the first integrator 131 and the first summation node 133. The receiver 100 also comprises a fifth feedback back path 153 configured to feedback the filtered analog BB signal 111 to the first summation node 133. The fifth feedback path 153 is analog. The receiver 100 comprises a first switch S1 arranged in the fourth feedback path 145, a second switch S2 arranged in the fifth feedback path 153, a third switch S3 arranged in the second feedback path, and a fourth switch S4 arranged in the first feedback path 123. The receiver 100 is configured to selectively switch on and switch off the first to the fourth switches to thereby switch on and off the corresponding feedback paths 123, 125, 145, 153, in dependence on the signal type of the received analog BB signal. 14.

Below, a number of different configurations for the receiver will be described and the benefits of the different configurations will be discussed. Switch on means it is closed i.e. low impedance, a switch off means it is open, i.e. high impedance. N marks the number of delays cycles in the second feedback path 125.

S1 & S2 on, S3 & S4 Off
  This is a normal direct conversion mode with separate ABB and ADC. This mode could be described as a legacy mode for test, performance comparison etc.
  S1 and S2 paths set the gain, i.e., the fourth feedback path 145 and the fifth feedback path 153.
S1 & S3 on, S2 & S4 off, no delay (N=0)
  Local feedback is provided for first integrator for optimized capacitance area for narrow bandwidth (e.g. below 2 MHz) and moderate selectivity. Furthermore, a maximum SNR can be achieved.
  First order merged ABB and ADC STF and second order NTF.
  S1 and S3 paths set the gain, i.e., the fourth feedback path 145 and the second feedback path 125.
  As described above this is the preferable configuration when the received analog BB signal is a 2 G signal.
S1, S3 & S4 on, S2 Off, N>=0
  Local feedback for first integrator for optimized capacitance area for narrow bandwidth and high selectivity.
  The Feedback delay used to boost selectivity so that TX-leakage is minimized. The
  This mode is optimized for Optimized for a wider bandwidths especially in FDD use cases. For example 3G, LTE (especially for LTE modes with bandwidth of 5 MHz and 10 MHz).
  More than first order merged ABB and ADC STF and second order NTF with freely adjustable notch in the NTF.

S1 and S3 paths, i.e., the fourth feedback path 145 and the second feedback path 125, set the gain, S4 path, i.e., the first feedback path, sets the NTF notch. Hence, S4 is pushes one NTF notch to higher frequencies for optimal SNR across the channel bandwidth.

It should be mentioned that the delay is required only in certain use cases since in certain 3 G and LTE bands TX and RX are very close while in other case it may be very large (>100 MHz).

S2, S3 & S4 on, S1 off, N>1

Wide bandwidth and high selectivity.

More than second order merged ABB and ADC STF and freely adjustable notch in the NTF (excluding passive RC-filter).

S2 and S3 paths, i.e., the fifth feedback path 153 and the second feedback path 125, set the gain. S2 path sets the NTF notch and S4 path adjusts it.

S2 and S3 on, S1 and S4 Off, No Delay (N=0)

This mode works for most LTE modes including intra-band carrier-aggregation.

With fast enough Operational Amplifiers the best SNR can be achieved.

In certain use FDD use cases S4 may be switched on too for the notch tuning.

S2, S3 & S4 on, S1 Off, No Delay (N=0)

Widest bandwidth and normal selectivity.

Second order merged ABB and ADC STF and freely adjustable notch in the NTF (excluding passive RC-filter).

S2 and S3 paths set the gain. S2 path sets the NTF notch and weak S4 path adjusts filter high frequency response.

Figure 5:
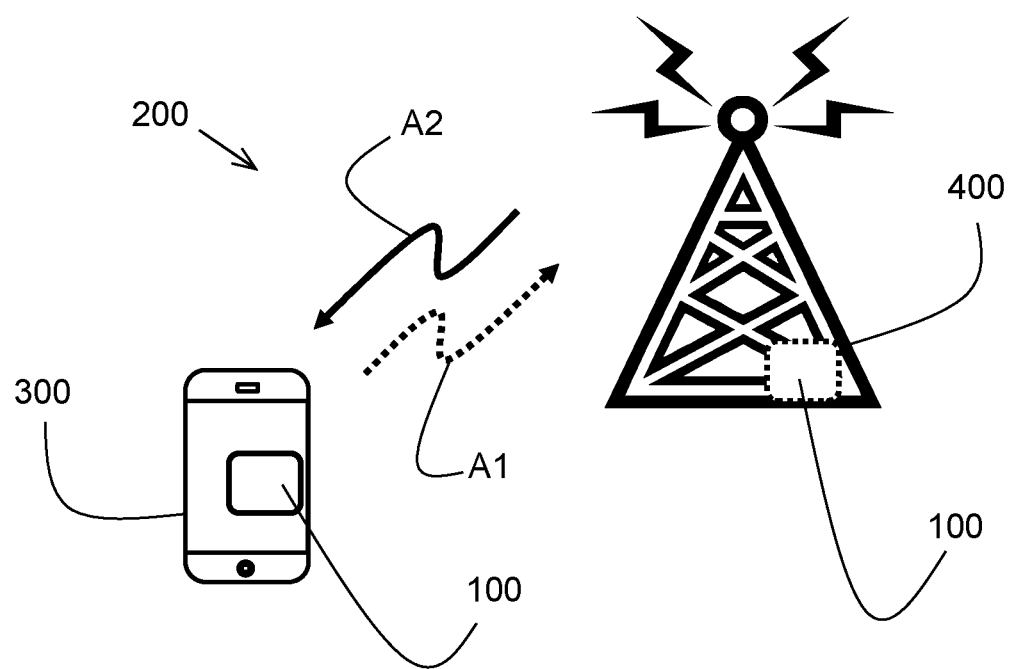
FIG. 5 shows schematically a communication device in a wireless communication system.

FIG. 5 shows schematically a communication device 300 in a wireless communication system 200. The communication device 300 comprises a receiver 100 according to an embodiment of the application. The wireless communication system 200 also comprises a network node 400 which comprises a receiver 100 according to an embodiment of the application. The dotted arrow A1 represents transmissions from the communication device 300 to the network node 400, which are usually called uplink transmissions. The full arrow A2 represents transmissions from the network node 400 to the communication device 300, which are usually called downlink transmissions.

The communication device 300 may be any of a User Equipment (UE) in Long Term Evolution (LTE), mobile station (MS), wireless terminal or mobile terminal which is enabled to communicate wirelessly in a wireless communication system, sometimes also referred to as a cellular radio system. The UE may further be referred to as mobile telephones, cellular telephones, computer tablets or laptops with wireless capability. The UEs in the present context may be, for example, portable, pocket-storable, hand-held, computer-comprised, or vehicle-mounted mobile devices, enabled to communicate voice or data, via the radio access network, with another entity, such as another receiver or a server. The UE can be a Station (STA), which is any device that contains an IEEE 802.11-conformant Media Access Control (MAC) and Physical Layer (PHY) interface to the Wireless Medium (WM).

The radio network nodes may be of different classes such as, e.g., macro eNodeB, home eNodeB or pico base station, based on transmission power and thereby also cell size. The radio network node can be a Station (STA), which is any device that contains an IEEE 802.11-conformant Media Access Control (MAC) and Physical Layer (PHY) interface to the Wireless Medium (WM).

The invention claimed is:

1. A receiver, comprising:
an analog baseband (ABB) filter stage including an ABB filter stage input configured to receive an analog baseband (BB) signal and an ABB filter stage output configured to provide a filtered analog BB signal;
an analog-to-digital converter (ADC) stage, including:
an ADC stage input configured to receive the filtered analog BB signal and an ADC stage output configured to provide a digital BB signal; and
an ADC comprising an ADC input configured to receive the filtered analog BB signal or a signal derived therefrom as an ADC input signal, and wherein the ADC is configured to perform an analog-to-digital (A/D) conversion of the ADC input signal to derive the digital BB signal;
a first feedback path configured to feedback the filtered analog BB signal to the ABB filter stage; and
a second feedback path configured to feedback the digital BB signal to the ABB filter stage, wherein the second feedback path comprises a first feedback digital-to-analog (D/A) converter.

2. The receiver according to claim 1, wherein the first feedback path or the second feedback path is switchable; or the first feedback path and the second feedback path are switchable.

3. The receiver according to claim 2, wherein the receiver is configured to selectively switch on and switch off the first feedback path and the second feedback path in response to a signal type of the received analog BB signal.

4. The receiver according to claim 1, wherein the second feedback path comprises a delay element.

5. The receiver according to a claim 1, wherein the ABB filter stage comprises a first summation node, a first integrator, a second summation node and a second integrator;
wherein the first summation node is configured to receive the analog BB signal and the filtered analog BB signal from the first feedback path, and to provide a first sum signal to the first integrator;
wherein the first integrator is configured to integrate the first sum signal to derive a first integrated signal;
wherein the second summation node is configured to receive the first integrated signal and the digital BB signal from the second feedback path, and to provide a second sum signal to the second integrator;
wherein the second integrator is configured to integrate the second sum signal to derive the filtered analog BB signal.

6. The receiver according to claim 5, wherein the ADC stage comprises a third integrator coupled between the ADC stage input and the ADC input.

7. The receiver according to claim 6, wherein the ADC stage comprises a third summation node at the ADC stage input and a third feedback path, wherein the third feedback path is configured to feed back the digital BB signal to the third summation node, wherein the third feedback path comprises a second feedback D/A converter, and
wherein the third summation node is configured to sum the digital BB signal from the third feedback path and the filtered analog BB signal and to provide a resulting third sum signal to the third integrator.

8. The receiver according to claim 5, wherein the ABB filter stage comprises a fourth feedback path connected between a first integrator output of the first integrator and the first summation node.

9. The receiver according to claim 5, further comprising a fifth feedback back path configured to feedback the filtered analog BB signal to the first summation node.

10. The receiver according to claim 9, wherein at least one of the first feedback path, the second feedback path, the third feedback path, the fourth feedback path, or the fifth feedback path is switchable.

11. The receiver according to claim 10, wherein the receiver is configured to selectively switch on and switch off the first to fifth feedback paths in response to a signal type of the received analog BB signal.

12. A communication device for a wireless communication system, the communication device comprising a receiver comprising:
an analog baseband (ABB) filter stage including an ABB filter stage input configured to receive an analog baseband (BB) signal and an ABB filter stage output configured to provide a filtered analog BB signal;
an analog-to-digital converter (ADC) stage, including:
an ADC stage input configured to receive the filtered analog BB signal and an ADC stage output configured to provide a digital BB signal; and
an ADC comprising an ADC input configured to receive the filtered analog BB signal or a signal derived therefrom as an ADC input signal, and wherein the ADC is configured to perform an analog-to-digital (A/D) conversion of the ADC input signal to derive the digital BB signal;
a first feedback path configured to feedback the filtered analog BB signal to the ABB filter stage; and
a second feedback path configured to feedback the digital BB signal to the ABB filter stage, wherein the second feedback path comprises a first feedback digital-to-analog (D/A) converter.

13. The communication device of claim 12, wherein the first feedback path or the second feedback path is switchable; or
the first feedback path and the second feedback path are switchable.

14. The communication device of claim 13, wherein the receiver is configured to selectively switch on and switch off the first feedback path and the second feedback path in response to a signal type of the received analog BB signal.

15. The communication device of claim 12, wherein the second feedback path comprises a delay element.

16. The communication device of claim 12, wherein the ABB filter stage comprises a first summation node, a first integrator, a second summation node and a second integrator,
wherein the first summation node is configured to receive the analog BB signal and the filtered analog BB signal from the first feedback path, and to provide a first sum signal to the first integrator,
wherein the first integrator is configured to integrate the first sum signal to derive a first integrated signal,
wherein the second summation node is configured to receive the first integrated signal and the digital BB signal from the second feedback path, and to provide a second sum signal to the second integrator,
wherein the second integrator is configured to integrate the second sum signal to derive the filtered analog BB signal.

17. The communication device of claim 16, wherein the ADC stage comprises a third integrator coupled between the ADC stage input and the ADC input.

18. The communication device of claim 17, wherein the ADC stage comprises a third summation node at the ADC stage input and a third feedback path, wherein the third feedback path is configured to feed back the digital BB signal to the third summation node,
wherein the third feedback path comprises a second feedback D/A converter, and
wherein the third summation node is configured to sum the digital BB signal from the third feedback path and the filtered analog BB signal and to provide a resulting third sum signal to the third integrator.

* * * * *